United States Patent
Tsuchiya et al.

(10) Patent No.: US 7,659,212 B2
(45) Date of Patent: Feb. 9, 2010

(54) PROCESS CONTROL METHOD IN SPIN ETCHING AND SPIN ETCHING APPARATUS

(75) Inventors: Masato Tsuchiya, Gunma (JP); Syunichi Ogasawara, Gunma (JP)

(73) Assignee: Mimasu Semiconductor Industry Co., Ltd., Gunma (JP)

( * ) Notice: Subject to any disclaimer, the term of this patent is extended or adjusted under 35 U.S.C. 154(b) by 700 days.

(21) Appl. No.: 10/586,873

(22) PCT Filed: Mar. 22, 2004

(86) PCT No.: PCT/JP2004/003817

§ 371 (c)(1),
(2), (4) Date: Jul. 21, 2006

(87) PCT Pub. No.: WO2005/091346

PCT Pub. Date: Sep. 29, 2005

(65) Prior Publication Data

US 2008/0242101 A1     Oct. 2, 2008

(51) Int. Cl.
*H01L 21/306*     (2006.01)

(52) U.S. Cl. ............ 438/745; 156/345.15; 257/E21.219

(58) Field of Classification Search ........................ None
See application file for complete search history.

(56) References Cited

U.S. PATENT DOCUMENTS

2002/0046757 A1     4/2002     Inagaki et al.

FOREIGN PATENT DOCUMENTS

| EP | 1 172 844 A2 | 1/2002 |
|---|---|---|
| JP | 61287124 A | 12/1986 |
| JP | 01309332 A | 12/1989 |
| JP | 2002086084 A | 3/2002 |

*Primary Examiner*—Allan Olsen
(74) *Attorney, Agent, or Firm*—Arent Fox LLP

(57) ABSTRACT

The present invention provides a process control method in spin etching capable of realizing uniformity in etching amount in etching treatment for even wafers each having various conditions, and achieving uniformity of thickness values among etched wafers. In the present invention, weight of a wafer before etching is measured in units of $1/1000$ g, followed by predetermined etching treatment in a spin etching section. Thereafter, weight of the wafer is again measured in units of $1/1000$ g after rinsing and drying treatment of the wafer, and then an actual etching amount is calculated from a difference between weight before and after etching of the wafer, confirming an etching rate each time etching to thereby control an etching time.

6 Claims, 6 Drawing Sheets

PROCESS CONTROL METHOD IN SPIN ETCHING AND SPIN ETCHING APPARATUS

CROSS-REFERENCE TO RELATED APPLICATION

This application is a National Stage entry of International Application No PCT/JP2004/003817, filed Mar. 22, 2004, the entire specification claims and drawings of which are incorporated herewith by reference.

TECHNICAL FIELD

The present invention relates to a novel process control method in spin etching, for example, for an etching amount and an etching solution, and a spin etching apparatus.

BACKGROUND ART

In fabrication of devices in recent years, there has been encountered a situation where wet etching treatment for a wafer with a spin etching apparatus is many times employed for purposes to increase a mechanical strength and to improve electric and thermal characteristics of a chip. In wet etching, with increase in the number of wafers processed therein, an etching rate is reduced since circulation use of an etching solution is common. The most important control item in the wet etching is control of a wafer thickness after the etching treatment. The thickness control is preferably conducted using a method for measuring a wafer thickness directly in light of its purpose. There arise cases, however, where patterning has been applied and electrodes have been formed on almost all wafers when a thickness of a wafer is measured, and further where a tape or a glass substrate is adhered on a wafer in order to protect the patterned surface thereof. A method for measuring a thickness with a good precision in such various conditions is very difficult to be conducted or requires a very expensive measuring instrument.

DISCLOSURE OF THE INVENTION

The present invention has been made in light of such circumstances in conventional technology and an object of the present invention is to provide a process control method in spin etching capable of realizing uniformity in etching amount in etching treatment for even wafers each having various conditions, and achieving uniformity of thickness values among etched wafers, and a spin etching apparatus.

The point of the present invention resides in that when spin etching a wafer weight control of the wafer is performed as a method for controlling an etching amount of the wafer to a given value. The method for controlling the etching amount of the wafer is divided to two ways; one is to control a stock removal by etching to a given value and the other is to control weight of the finished wafer to a given value.

A first aspect of a method for process control in spin etching of the present invention (a method for controlling a stock removal from a wafer by etching to a given value) comprises:

(a) a first step of taking out one wafer from a loading cassette;

(b) a second step of measuring weight $W_1$ of the wafer before etching;

(c) a third step of calculating an etching time $T_0$ with the following equation (1):

$$T_0 = V_0 \div R \quad (1),$$

wherein $T_0$ is an etching time (min), $V_0$ is a target etching amount (g), R is an initial value $R_0$ (g/min) of an etching rate of a starting etching solution to be used, an etching rate $R_1$ (g/min) of the etching solution after etching or an etching rate $R_2$ (g/min) of the etching solution into which an additional etching solution has been added.

(d) a fourth step of etching the wafer for the calculated time $T_0$;

(e) a fifth step of measuring weight $W_2$ of the wafer after etching;

(f) a sixth step of calculating an etching rate $R_1$ of the etching solution after etching with the following equation (2):

$$R_1 = (W_1 - W_2) \div T_0 \quad (2),$$

wherein $R_1$ is an etching rate of an etching solution after etching, $W_1$ is weight (g) of a wafer before etching, $W_2$ is weight (g) of a wafer after etching and $T_0$ is an etching time.

(g) a seventh step of accommodating the etched wafer; and (h) an eighth step of determining whether or not an etching rate $R_1$ of the etching solution after etching falls within an allowable range, wherein when it is decided in the eighth step that an etching rate $R_1$ falls within the allowable range, the process from the first step to the seventh step is performed on a wafer to be processed in the next order, or when it is decided in the eighth step that an etching rate $R_1$ falls outside the allowable range, there is performed a ninth step of adding an additional etching solution into the etching solution to restore the etching rate $R_1$ to the etching rate $R_2$ in the vicinity of the initial value $R_0$, and thereafter the process from the first step to the seventh step is performed on a wafer to be processed in the next order. According to the first aspect of the method of the present invention, spin etching can be continuously conducted such that an etching amount V is controlled to a given value.

A second aspect of a method for process control in spin etching of the present invention (a method for controlling weight of a finished wafer) comprises:

(a) a first step of taking out one wafer from a loading cassette;

(b) a second step of measuring weight $W_1$ of the wafer before etching;

(c) a third step of determining an etching amount V with the following equation (3):

$$V = W_1 - W_0 \quad (3),$$

wherein V indicates an etching amount (g), $W_1$ is weight (g) of the wafer before etching, and $W_0$ is weight of a finished wafer, that is target weight (g) of a wafer after etching;

(d) a fourth step of calculating an etching time T with the following equation (4):

$$T = V \div R \quad (4),$$

wherein T is an etching time (min), V is a target etching amount (g), R is an initial value $R_0$ (g/min) of an etching rate of a starting etching solution, an etching rate $R_1$ (g/min) of the etching solution after etching or an etching rate $R_2$ (g/min) of the etching solution into which an additional etching solution has been added;

(e) a fifth step of etching the wafer;

a six step of measuring weight $W_2$ of the wafer after etching;

(g) a seventh step of calculating an etching rate $R_1$ of the etching solution after etching with the following equation (5):

$$R = (W_1 - W_2) \div T \quad (5),$$

wherein $R_1$ is an etching rate (g/min) of the etching solution after etching, $W_1$ is weight (g) of the wafer before etching, $W_2$ is weight (g) of the wafer after etching and T is the etching time, (h) an eighth step of accommodating the etched wafer; and (i) a ninth step of determining whether or not an etching rate $R_1$ of the etching solution after etching falls within an allowable range;

wherein when it is decided in the ninth step that an etching rate $R_1$ falls within the allowable range, the process from the first step to the seventh step is performed on a wafer to be processed in the next order, or when it is decided in the ninth step that an etching rate $R_1$ falls outside the allowable range, there is performed a tenth step of adding an additional etching solution into the etching solution to restore the etching rate $R_1$ to the etching rate $R_2$ in the vicinity of the initial value $R_0$, and thereafter the process from the first step to the eighth step is performed on a wafer to be processed in the next order. According to the second aspect of the method of the present invention, spin etching can be continuously conducted such that the weight of the finished wafer is controlled to a given value.

When an etching time $T_0$ is obtained with the equation (1) in the third step of the first aspect of the method of the present invention, or when an etching time T is obtained with the equation (4) in the fourth step of the second aspect of the present invention the etching rate R is an initial value $R_0$ of an etching rate of the etching solution to be used, an etching rate $R_1$ after etching or an etching rate $R_2$ of the etching solution into which an additional etching solution has been added. An initial value $R_0$ of an etching rate of an etching solution when use of the etching solution is started and/or an etching rate $R_2$ of the etching solution which has been restored to a value in the vicinity of an initial value of etching rate by adding an additional etching solution into the used etching solution is preferably measured for confirmation by additionally providing a measuring step using a dummy wafer described later.

The confirmation treatment for the initial value $R_0$ of the etching rate of the starting etching solution and/or the etching rate $R_2$ of the etching solution which has been restored to a value in the vicinity of the initial value by adding an additional etching solution into the used etching solution, comprises:

(a) a first step of taking out one wafer from a dummy wafer holding table;

(b) a second step of measuring weight $D_1$ of the dummy wafer before etching;

(c) a third step of etching the dummy wafer for a given time $t_0$;

(d) a fourth step of measuring weight $D_2$ of the dummy wafer after etching;

(e) a fifth step of calculating an etching rate $r_0$ of the etching solution after etching with the following equation (6):

$$r_0 = (D_1 - D_2) \div t_0 \quad (6),$$

wherein $r_0$ is an etching rate (g/min) of the etching solution after etching, $D_1$ is weight (g) of the dummy wafer before etching, $D_2$ is weight (g) of the dummy wafer after etching, and to is an etching time;

(g) a seventh step of transferring the etched dummy wafer to the dummy wafer holding table; and (h) an eighth step of determining whether or not weight of the etched dummy wafer falls within a defined range;

wherein when it is decided in the eighth step that weight of the dummy wafer falls within the defined range, the confirmation treatment for the etching rate is terminated, or when it is decided in the eighth step that the weight of the dummy wafer falls outside the defined range, there is performed a ninth step of generating an exchange request signal for the used dummy wafer, and thereafter the confirmation treatment for the etching rate is terminated. Incidentally, when an exchange request signal for the used dummy wafer is issued, a different dummy wafer is used in the next measurement since the used dummy wafer is not suitable for further use.

In the method of the present invention, weight control of a wafer is performed as a method for controlling an etching amount of the wafer to a given value. Roughly speaking, the following procedure is performed therefor.

The weight of a wafer before etching is measured in units of $\frac{1}{1000}$ g, followed by predetermined etching treatment in a spin etching section. Thereafter, the weight of the wafer is again measured in units of $\frac{1}{1000}$ g after rinsing and drying treatment of the wafer, and then an actual etching amount is calculated from a difference between weight before and after etching of the wafer, confirming an etching rate each time etching to thereby control an etching time.

A first one wafer etched in a new etching solution or in an etching solution after an additional etching solution is added is a dummy wafer and etching treatment is performed on the dummy wafer for a fixed time to confirm an etching rate. In etching treatment of a second wafer and those subsequent thereto, a change in etching rate of the etching solution is calculated from a change in weight of the wafer before and after etching to conduct time control and to correct a shortage of etching corresponding to reduction in the etching rate. Since correction only with extension of the etching time results in extension of a treatment time and reduction of productivity, the maximum value of a time correction or the limit value of an etching rate is determined. When the value of the time correction equals to the above maximum value or more, or the value of the etching rate equals to the above limit value or more, an additional etching solution is added into a circulating system of the etching solution in order to recover an etching rate.

A spin etching apparatus of the present invention comprises: a spin etching section for etching a wafer; an etching solution circulating tank for storing and circulating the etching solution; an etching solution feed line for feeding the etching solution from the etching solution circulating tank to the spin etching section; an etching solution recovering line for recovering the etching solution used in the spin etching section into the etching solution circulating tank; a weight measuring section for measuring weight before and after etching of the wafer etched in the spin etching section; and a handling mechanism section in which the wafer to be etched is transferred to the weight measuring section, and after the weight of the wafer is measured, the wafer is transferred to the spin etching section, the etched wafer is transferred to the weight measuring section from the spin etching section, and after the weight of the etched wafer is measured, the wafer is taken out from the weight measuring section.

BEST MODE FOR CARRYING OUT THE INVENTION

Description will be given of embodiments of the present invention below based on the accompanying drawings, and it is needless to say that the embodiments shown in figures are presented by way of illustration and various modification or variations can be implemented as far as not departing from the technical concept of the present invention.

Figure 4:
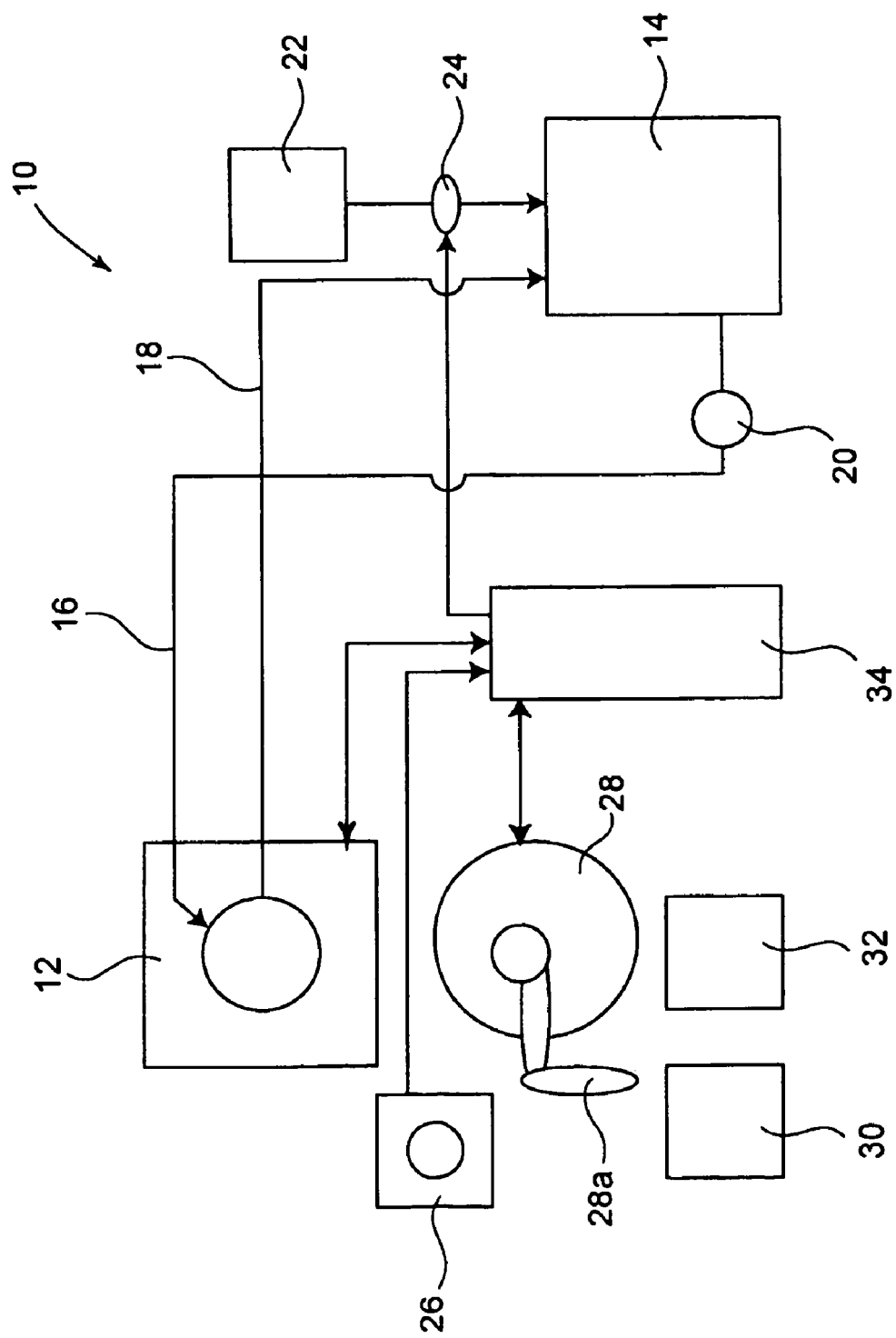
FIG. 4 is a block diagram showing an embodiment of a spin etching apparatus of the present invention.

First of all, description is presented of a spin etching apparatus of the present invention using FIG. 4. In FIG. 4, a spin etching apparatus 10 according to the present invention has a spin etching section 12 where spin etching is performed on a wafer. Reference numeral 14 designates an etching solution circulating tank circulating an etching solution. The etching solution is fed to the spin etching section 12 by way of an etching solution feed line 16 for the etching solution circulating tank. The etching solution used in the spin etching section 12 is recovered to the etching solution circulating tank 14 by way of an etching solution recovery line 18. Reference numeral 20 designates an etching solution circulating pump provided in the etching solution feed line 16 and is used in feeding the etching solution to the spin etching section 12 from the etching solution circulating tank 14. Reference numeral 22 designates an additional etching solution tank storing a new etching solution and is connected to the etching solution circulating tank 14 by way of an etching solution adding pump 24. If the need arises, the new etching solution may be added to the etching solution circulating tank 14.

Reference numeral 26 designates a weight measuring section, which measures weight of a wafer before and after etching the wafer in the spin etching section. Reference numeral 28 designates a handling mechanism section disposed adjacent to the spin etching section and having a robot hand section 28a, which transfers a wafer accommodated in a loading cassette 30 to the weight measuring section 26 to measure the weight. And the handling mechanism section 28 functions not only to feed a wafer, the weight of which has been measured before the etching to the spin etching section 12, but also to transfer the etched wafer to the weight measuring section 26 from the spin etching section to measure the weight after the etching, and the wafer the weight of which has been measured after the etching is transferred to an unloading cassette 32 to take out the wafer.

Reference numeral 34 designates a control section constituted of a computer and others, which is electrically connected to the spin etching section 12, the weight measuring section 26, the handling mechanism section 28 and the etching solution adding pump 24, respectively, and exchanges signals therewith to perform necessary control thereof. The control section 34 exchanges signals with the handling mechanism section 28 to drive the robot hand section 28a of the handling mechanism section 28 for transferring a wafer from the loading cassette 30 to the weight measuring section 26, from the weight measuring section 26 to the spin etching section 12, from the spin etching section 12 to the weight measuring section 26 and from the weight measuring section 26 to the unloading cassette 32. The control section 34 exchanges signals with the weight measuring section 26 to control weight measuring operation on a wafer in the weight measuring section 26, and to receive weight data signals from the weight measuring section 26.

The control section 34 exchanges with the spin etching section 12 to control etching operation (an etching time, a rinse time, a drying time and others). In the control section 34, an etching rate is calculated from an etching time and a difference between weight of the wafer before and after etching. The control section 34 has a function for comparing the calculated etching rate with a predetermined initial value to decide whether or not the calculated etching rate falls within an allowable range. If the etching rate falls outside the allowable range, the contact section 34 gives an etching solution adding signal to the etching solution adding pump 24 to add a given quantity of an etching solution to the etching solution circulating tank 14 so as to return an etching rate to a value in the vicinity of an initial value. Incidentally, in confirmation treatment using a dummy wafer for an etching rate thereon described later a dummy wafer is etched, and in this case, etching treatment can be performed by using the same construction as the above-mentioned etching apparatus with the exception that the loading cassette 30 or the unloading cassette 32 are replaced with a dummy wafer holding table.

Figure 1:
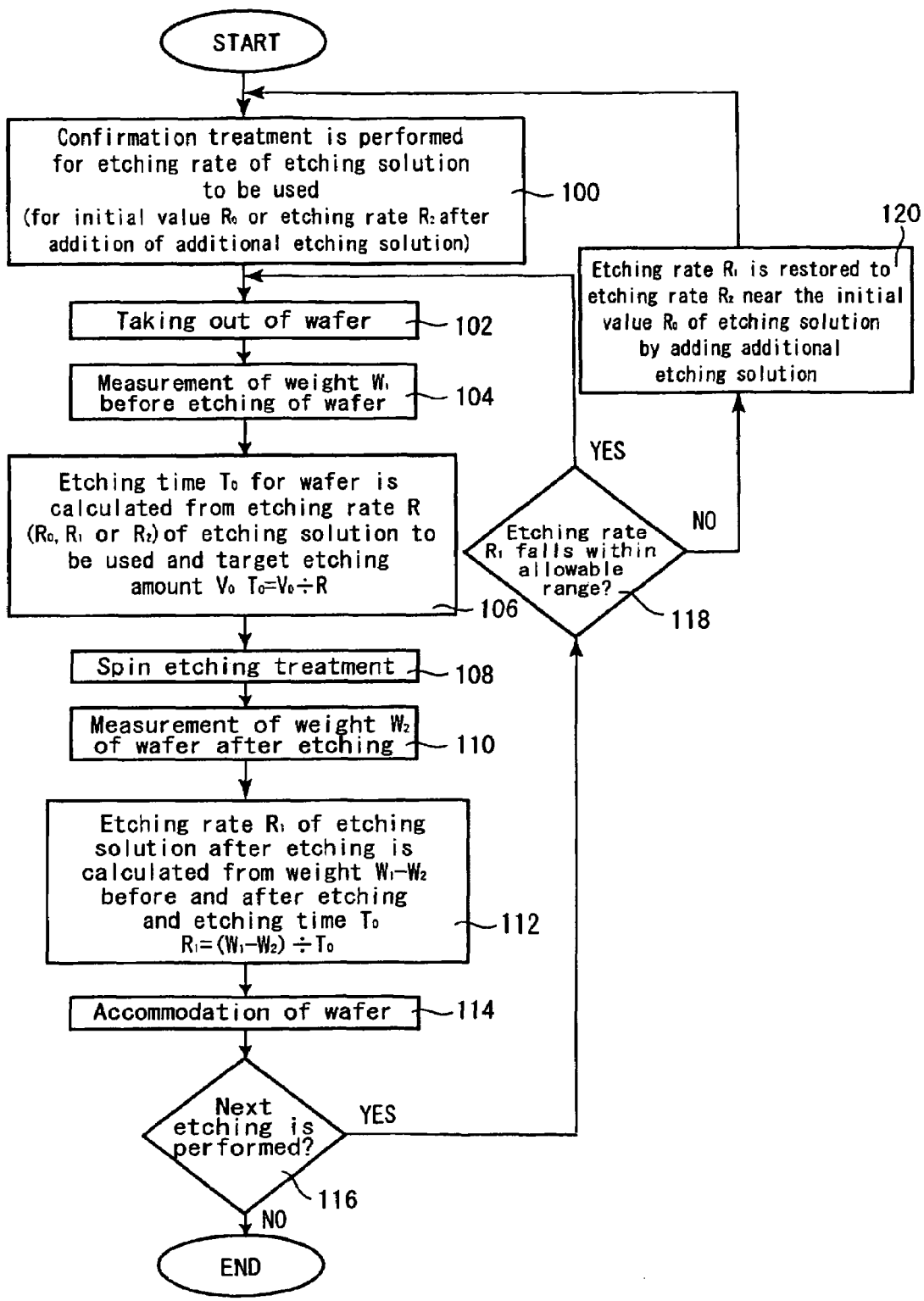
FIG. 1 is a flowchart showing an example step sequence according to a first aspect of the method of the present invention.
Figure 2:
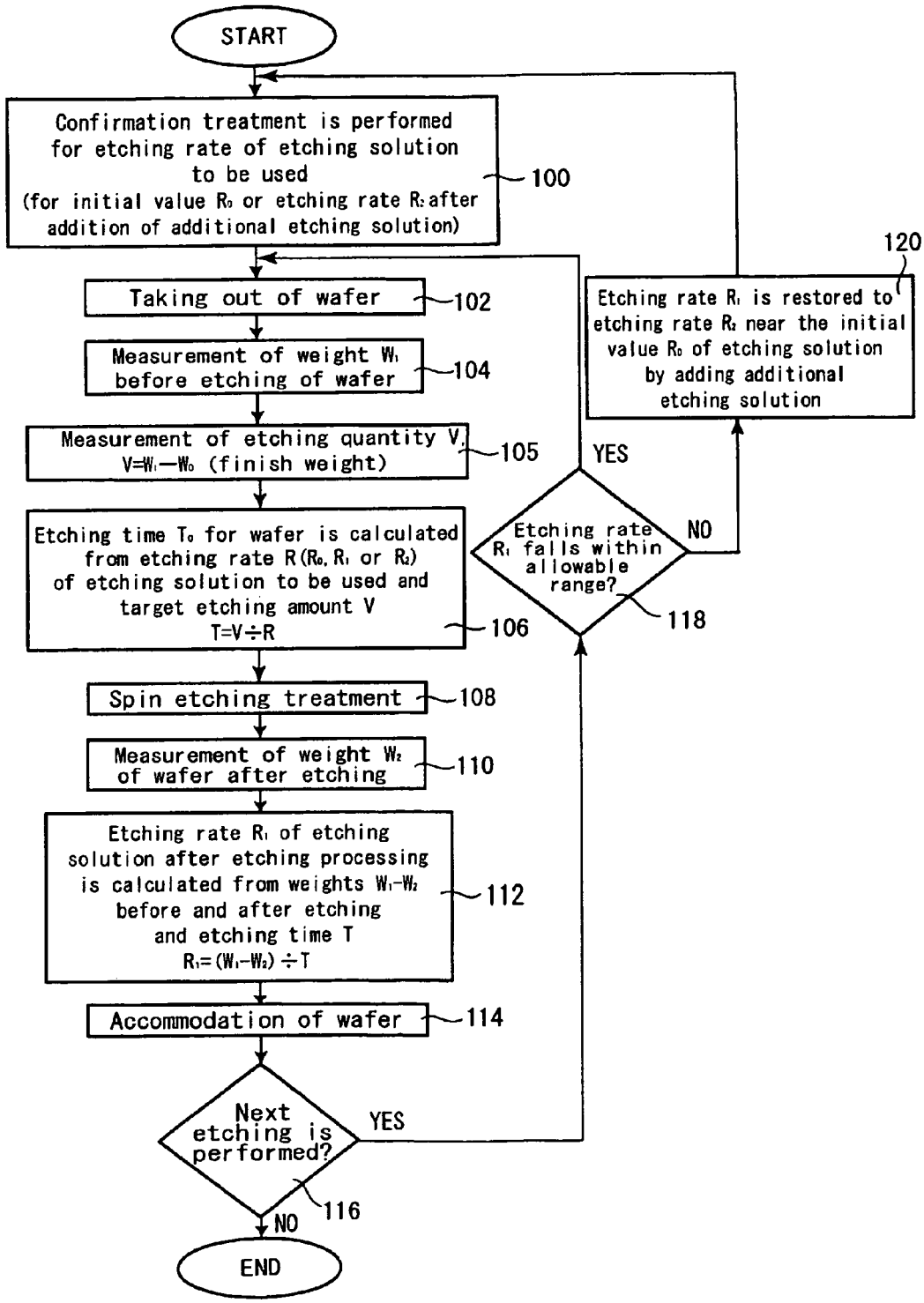
FIG. 2 is a flowchart showing another example step sequence according to a second aspect of the method of the present invention.

Subsequent to this, description will be given of a process control method in spin etching of the present invention. There are two ways of methods for controlling an etching amount in the present invention. One is a method for controlling an etching stock removal of a wafer to a given value (FIG. 1) and the other is a method for controlling weight of a finished wafer to a given value (FIG. 2).

Description will be given of the first way of a process control method in a spin etching of the present invention with a spin etching apparatus of the present invention using FIG. 1 (a method for controlling an etching stock removal of a wafer to a given value). First of all, confirmation treatment is performed for an etching rate R of an etching solution to be used (a preliminary step, step 100). In the confirmation treatment for an etching rate, which will be detailed later, there is measured for confirmation an initial value $R_0$ of an etching solution to be used or an etching rate $R_2$ of the etching solution into which an additional etching solution has been added. On the other hand, wafers to be subjected to spin etching are prepared and set in a loading cassette 30. As shown in FIG. 1, one wafer is taken out from the loading cassette 30 (a first step, step 102). The wafer is transferred to a weight measuring section 26 with a robot hand section 28a to measure the weight $W_1$ of the wafer before etching (a second step, step 104).

An etching time $T_0$ for the wafer is calculated using the following equation (1) in the control section 34 from the etching rate R of the etching solution to be used and a target etching amount $V_0$ (a third step, step 106):

$$T_0 = V_0 \div R \qquad (1),$$

wherein $T_0$ is an etching time (min), $V_0$ is a target etching amount (g), R is an etching rate (g/min) of an etching solution to be used. The etching rate R is, to be concrete, an initial value $R_0$ of an etching solution to be used, an etching rate $R_1$ of the etching solution after etching or an etching rate $R_2$ of the etching solution into which an additional etching solution has been added. Then, the wafer is transferred to the spin etching section 12 with the robot hand section 28a, is subjected to spin etching only for the calculated etching time $T_0$, and thereafter is rinsed and dried in given conditions. In the flowchart of FIG. 1, the spin etching treatment is shown as collectively including the spin etching, the rinsing and drying treatment (a fourth step, step 108).

The wafer subjected to the spin etching treatment is transferred to the weight measuring section 26 with the robot hand section 28a to measure weight $W_2$ of the wafer after etching (a fifth step, step 110). An etching rate $R_1$ of the etching solution after etching is calculated using the following equation (2) in the control section 34 from the weight $W_1$ of the wafer before etching, the weight $W_2$ of the wafer after etching and the etching time $T_0$ (a sixth step, step 112):

$$R_1 = (W_1 - W_2) \div T_0 \quad (2),$$

wherein $R_1$ is an etching rate (g/min) of an etching solution after etching, $W_1$ is weight (g) of a wafer before etching, $W_2$ is weight (g) of a wafer after etching and $T_0$ is an etching time. The etched wafer is accommodated into the unloading cassette 32 with the robot hand section 28a (a seventh step, step 114).

It is decided in the control section 34 whether or not the calculated etching rate $R_1$ falls within a predetermined allowable range for an etching rate (an eighth step, step 118). If it is decided in the eighth step that a calculated etching rate $R_1$ falls within the allowable range (YES), a new next wafer is subjected to a process from the first step to the seventh step. On the other hand, it is decided in the eighth step that the calculated etching rate $R_1$ falls outside the allowable range (NO), an additional etching solution (a new etching solution) is added into the etching solution stored in the etching solution circulating tank 14 and the etching rate $R_1$ thereof is restored to a value $R_2$ in the vicinity of the initial value $R_0$ (a ninth step, step 120). Then, the new next wafer is subjected to the process from the first step to the seventh step. In this case, the etching rate $R_2$ is, as described above, measured in the confirmation treatment for an etching rate and thus obtained etching rate $R_2$ is used as an etching rate R in the equation (1). Incidentally, it is preferable that, as shown in FIG. 1, a termination deciding step (step 116) is provided between the seventh step (step 114) and the eighth step (step 118) and if next etching is performed, the eighth step (step 118) is conducted, while if next etching is not performed, the operation is terminated.

Description will be given, then, of the second way of a process control method of in a spin etching of the present invention with a spin etching apparatus of the present invention using FIG. 2 (a method for controlling weight of a finished wafer to a given value). First of all, in a similar way to that in the process of FIG. 1, confirmation treatment is performed for an etching rate R of an etching solution to be used (a preliminary step, step 100). On the other hand, wafers to be subjected to spin etching are prepared and set in the loading cassette 30. As shown FIG. 2, one wafer is taken out from the loading cassette 30 (a first step, step 102). The wafer is transferred to the weight measuring section 26 with the robot hand section 28a to measure the weight $W_1$ of the wafer before etching (a second step, step 104).

An etching amount V on the wafer is calculated using the following equation (3) in the control section 34 from the weight $W_1$ of the wafer before etching and weight $W_0$ of the finished wafer (a third step, step 105):

$$V = W_1 - W_0 \quad (3),$$

wherein V is an etching amount (g), $W_1$ is weight of a wafer before etching (g), $W_0$ is weight of a finished wafer, that is target weight of a wafer after etching.

An etching time T for the wafer is calculated in the control section 34 using the following equation (4) from an etching rate R of an etching solution to be used and the etching amount V (a fourth step, step 106):

$$T = V \div R \quad (4),$$

wherein T is an etching time (min), V is an etching amount (g) and R is an etching rate (g/min) of an etching solution to be used. The etching rate, to be concrete, indicates an initial value $R_0$ of an etching solution to be used, an etching rate $R_1$ of the etching solution after etching or an etching rate $R_2$ of the etching solution into which an additional etching solution has been added. Then, the wafer is transferred to the spin etching section 12 with the robot hand section 28a, is subjected to spin etching only for the calculated etching time T, and thereafter is rinsed and dried in given conditions. In the flowchart of FIG. 2, the spin etching treatment is shown as collectively including the spin etching, the rinsing and drying treatment (a fifth step, step 108).

The wafer subjected to the spin etching treatment is transferred to the weight measuring section 26 with the robot hand section 28a to measure weight $W_2$ of the wafer after etching (a sixth step, step 110). An etching rate $R_1$ of the etching solution after etching is calculated in the control section 34 using the following equation (5) from weight $W_1$ of the wafer before etching, weight $W_2$ of the wafer after etching and an etching time T (a seventh step, step 112):

$$R_1 = (W_1 - W_2) \div T \quad (5),$$

wherein $R_1$ is an etching rate (g/min) of an etching solution after etching, $W_1$ is weight (g) of a wafer before etching, $W_2$ is weight (g) of a wafer after etching and T is an etching time. The etched wafer is accommodated into the unloading cassette 32 with the robot hand section 28a (an eight step, step 114).

It is decided in the control section 34 whether or not the calculated etching rate $R_1$ falls within a predetermined allowable range for an etching rate (a ninth step, step 118). If it is decided in the ninth step that the calculated etching rate $R_1$ falls within the allowable range (YES), a new next wafer is subjected to a process from the first step to the eighth step. On other hand, if it is decided in the ninth step that the calculated etching rate $R_1$ falls outside the allowable range (NO), an additional etching solution (a new etching solution) is added into an etching solution stored in the etching solution circulating tank 14 and the etching rate $R_1$ is restored to an etching rate $R_2$ in the vicinity of an initial value $R_0$ (a tenth step, step 120). Then, a new next wafer is subjected to a process from the first step to the eighth step. In this case, the etching rate $R_2$ is, as described above, measured in etching rate confirmation treatment (step 100) and the etching rate $R_2$ is used as the etching rate R in the equation (4). Incidentally, it is preferable that, as shown in FIG. 2, a termination deciding step (step 116) is provided between the eighth step (step 114) and the ninth step (step 118) and if next etching is performed, the ninth step is conducted (step 118), while if next etching is not performed, the operation is terminated.

An etching solution used in a method of the present invention can be a mixed acid solution consisting of four components [a 50% solution of hydrofluoric acid (15 wt %)+a 60% solution of phosphoric acid (25 wt %)+a 70% solution of nitric acid (35 wt %) and a 95% solution of sulfuric acid (25 wt %)], and like. As an additional etching solution, a 50% solution of hydrofluoric acid and the like may be usable.

Figure 3:
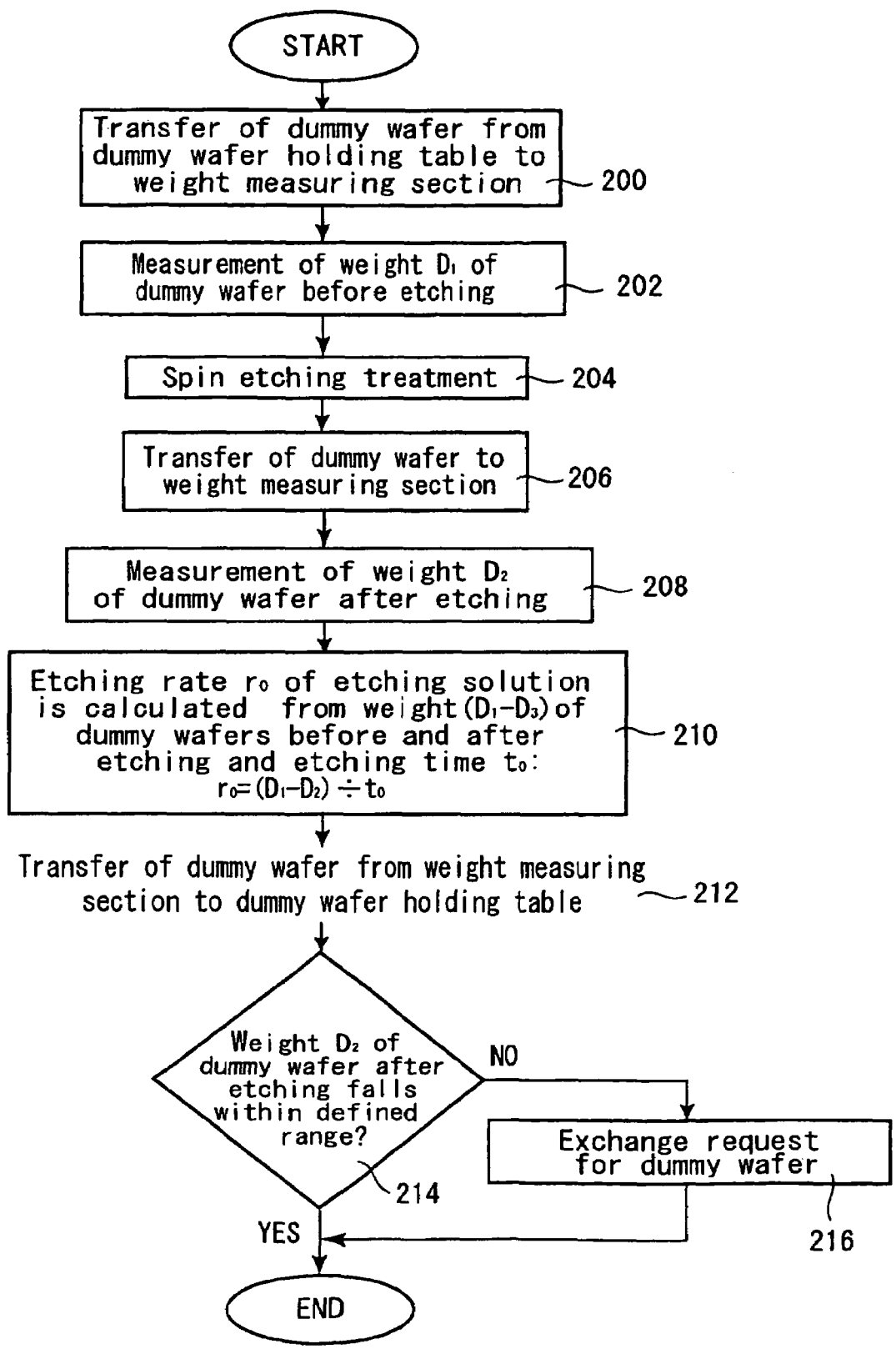
FIG. 3 is a flowchart showing an example step sequence of confirmation treatment for an etching rate.

Description will be given of confirmation treatment for an etching rate of an etching solution to be used (that is, an initial value $R_0$ of an etching solution to be used or an etching rate $R_2$ of the etching solution into which an additional etching solution has been added) using FIG. 3. First of all, a dummy wafer is prepared and set on the dummy wafer holding table. One dummy wafer is, as shown in FIG. 3, is taken out from the dummy wafer holding table (a first step, step 200). The dummy wafer is transferred to the weight measuring section 26 with the robot hand section 28a to measure weight $D_1$ of the wafer before etching (a second step, step 202).

The dummy wafer is transferred to the spin etching section 12 with the robot hand section 28a, is subjected to spin etching only for a given time $t_0$, and thereafter is rinsed and dried in given conditions. The above etching time $t_0$ may be appropriately set to a value on the order in the range of 10 sec to 100 sec. In the flowchart of FIG. 1, the spin etching treatment is shown as collectively including the spin etching, the rinsing and drying treatment (a third step, step 204).

The wafer subjected to the spin etching treatment is transferred to the weight measuring section 26 with the robot hand section 28a (a fourth step, step 206) to measure weight $D_2$ of the wafer after etching (a fifth step, step 208). An etching rate $r_0$ of the etching solution is calculated in the control section 34 using the following equation (6) from the weight $D_1$ of the dummy wafer before etching, the weight $D_2$ of the dummy wafer after etching and the etching time $t_0$ (a sixth step, step 210):

$$r_0 = (D_1 - D_2) \div t_0 \qquad (6),$$

wherein $r_0$ is an etching rate (g/min) of an etching solution, $D_1$ is weight (g) of a dummy wafer before etching, $D_2$ is weight (g) of a dummy wafer after etching and $t_0$ is an etching time. The etched dummy wafer is transferred to the dummy wafer holding table with the robot hand 28a (a seventh step, step 212).

It is decided in the control section 34 whether or not the weight $D_2$ of the dummy wafer after etching falls within in a defined range (an eighth step, step 214). If it is decided in the eighth step that the weight $D_2$ of the dummy wafer falls within a defined range (YES), confirmation treatment for an etching rate is terminated. On the other hand, if it is decided in the eighth step that the weight $D_2$ of the dummy wafer falls outside the defined range (NO), the control section 34 outputs an exchange request signal (a ninth step, step 216). If an exchange request signal is output, the used dummy wafer is not suited for further use, so a new dummy wafer is used at the next measurement time. Incidentally, if an etching solution is a starting etching solution, the calculated etching rate $r_0$ may be used as an initial value $R_1$ and if an additional etching solution is added, the calculated etching rate $r_0$ may be used as an etching rate $R_2$ in the vicinity of an initial value $R_0$.

EXAMPLES

More concrete description will be given of the present invention showing examples below and it is needless to say that the examples are presented by way of illustration and should not be construed by way of limitation.

Empirical Example 1

Figure 5:
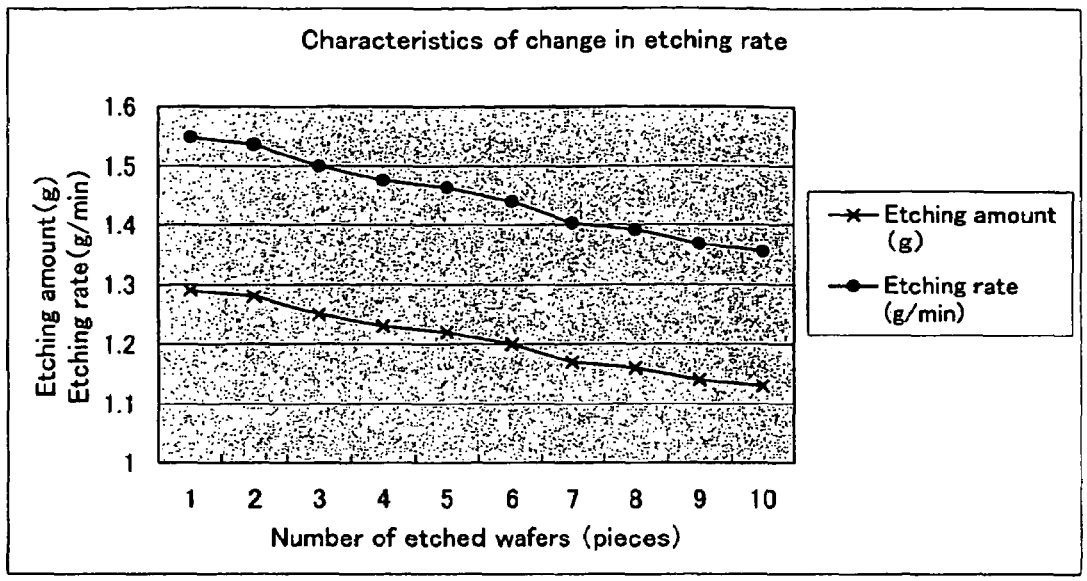
FIG. 5 is a graph showing changing characteristics of etching to etched wafers in Example 1.

An experiment was conducted on changes in an etching rate of an etching solution. Ten pieces of 8-inch silicon wafers were spin etched one wafer at a time using a spin etching apparatus (MSE-2000, manufactured by Mimasu Semiconductor Industry CO., LTD). An etching solution was 20 Kg of a mixed acid solution consisting of four components [a 50% solution of hydrofluoric acid (15 wt %)+a 60% solution of phosphoric acid (25 wt %)+a 70% solution of nitric acid (35 wt %) and a 95% solution of sulfuric acid (25 wt %)]. An etching rate of the etching solution was measured using a dummy wafer according to the confirmation treatment for an etching rate shown in FIG. 3. The obtained value of the etching rate was 1.560 (g/min). A target etching amount was set to 20 μm (1.444 g). The ten pieces of the silicon wafers were subjected to spin etching one wafer at a time using the etching solution at a temperature of 25° C.±1° C. for a fixed time of 64 sec. There were measured an etching amount (g) and an etching rate (g/min) for each spin etched wafer and the results thereof were shown in Table 1 and FIG. 5. As is apparent from the results of Table 1 and FIG. 5, it was confirmed that an etching rate decreased with increase in the number of spin etched wafers (wherein an etching rate of the etching solution after the tenth wafer was spin etched was 1.356 (g/min)), and an etching amount decreased in proportion to reduction in etching rate. The wafer No. 0 in Table 1 is a dummy wafer.

TABLE 1

| | Wafer Nos. | | | | | | | | | | |
|---|---|---|---|---|---|---|---|---|---|---|---|
| | 0 | 1 | 2 | 3 | 4 | 5 | 6 | 7 | 8 | 9 | 10 |
| Weight before etching | 38.18 | 51.81 | 52.71 | 52.71 | 53.8 | 53.81 | 53.81 | 53.8 | 53.82 | 53.79 | 53.81 |
| Weight after etching | 36.88 | 50.52 | 51.43 | 51.46 | 52.57 | 52.59 | 52.61 | 52.63 | 52.66 | 52.65 | 52.68 |
| Etching amount (g) | 1.30 | 1.29 | 1.28 | 1.25 | 1.23 | 1.22 | 1.2 | 1.17 | 1.16 | 1.14 | 1.13 |
| Etching rate (g/min) | 1.560 | 1.548 | 1.536 | 1.500 | 1.476 | 1.464 | 1.440 | 1.404 | 1.392 | 1.368 | 1.356 |

Example 1

Figure 6:
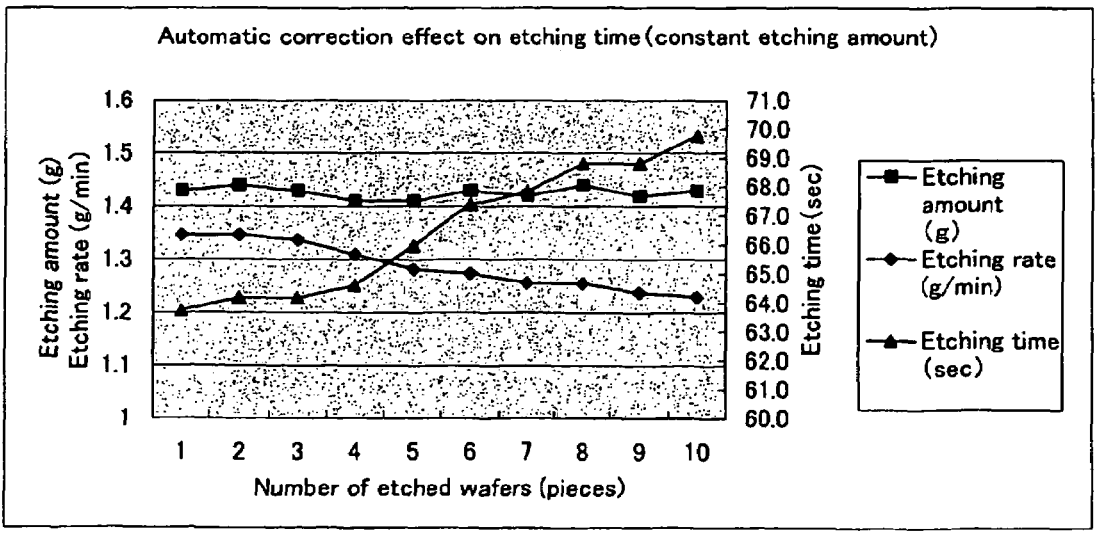
FIG. 6 is a graph showing changes in etching amount, etching rate and etching time to etched wafers in Example 1.
Figure 7:
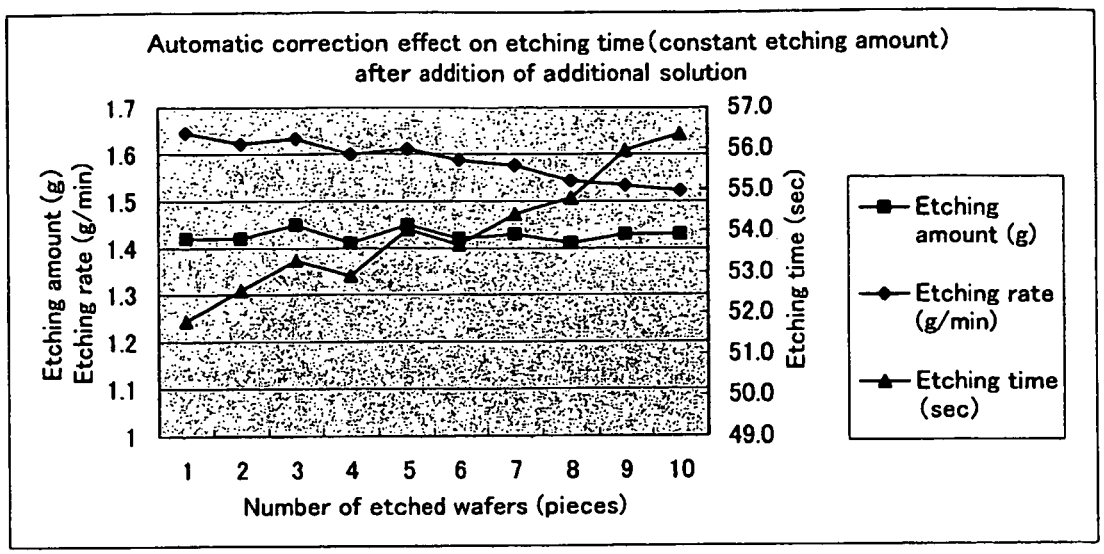
FIG. 7 is a graph showing changes in etching amount, etching rate and etching time to etched wafers in Example 2

An experiment was conducted for controlling an etching stock removal of a wafer to a constant value (without adding an additional etching solution). Ten pieces of 8-inch silicon wafers were spin etched one wafer at a time using a spin etching apparatus (MSE-2000, manufactured by Mimasu Semiconductor Industry CO., LTD.). In this experiment, the etching solution used in Empirical Example 1 was used consecutively as it was. An initial etching rate of the etching solution was 1.356 (g/min). The wafers were spin etched under condition that an etching amount (an etching stock removal) of each wafer was controlled to a constant value (20 μm: 1.444 g). That is, a process of the first step (step 102) to the seventh step (step 114) shown in the flowchart of FIG. 1 was repeated 10 times to spin etch the ten pieces of the wafers. In this example, an etching rate $R_1$ in the eighth step (step 118) was decided to fall within the allowable range and no additional etching solution was added. An etching amount (g), an etching rate (g/min) and an etching time (sec) were measured on each of the spin etched wafers. The results of the measurement were shown in Table 2 and FIG. 6. As shown in Table 2 and FIG. 6; it was found that if an etching rate decreased, a corresponding etching time increased automatically, from which an etching amount can be controlled to an almost constant value. In this Example, an etching rate of the etching solution after the tenth wafer was spin etched was 1.356 (g/min).

the first step (step 102) to the seventh step (step 114) of the flowchart shown in FIG. 1 was repeated 10 times to spin etch the ten pieces of the wafers. The additional etching solution was not added during the 10-time etching treatment. An etching amount (g), an etching rate g/min) and an etching time (sec) were measured on each of the spin etched wafers and the results there were shown in Table 3 and FIG. 7. As shown in

TABLE 2

| | Wafer Nos. | | | | | | | | | |
|---|---|---|---|---|---|---|---|---|---|---|
| | 1 | 2 | 3 | 4 | 5 | 6 | 7 | 8 | 9 | 10 |
| Weight before etching | 51.44 | 50.53 | 51.42 | 52.59 | 52.59 | 52.62 | 52.62 | 52.65 | 52.63 | 52.67 |
| Weight after etching | 50.01 | 49.09 | 49.99 | 51.18 | 51.18 | 51.19 | 51.2 | 51.21 | 51.21 | 51.24 |
| Etching amount (g) | 1.43 | 1.44 | 1.43 | 1.41 | 1.41 | 1.43 | 1.42 | 1.44 | 1.42 | 1.43 |
| Etching rate (g/min) | 1.347 | 1.347 | 1.337 | 1.309 | 1.282 | 1.273 | 1.256 | 1.256 | 1.238 | 1.229 |
| Etching time (sec) | 63.7 | 64.2 | 64.2 | 64.6 | 66.0 | 67.4 | 67.9 | 68.8 | 68.8 | 69.8 |

Example 2

There was conducted an experiment in which an etching stock removal of a wafer is controlled to a constant value (addition of an additional solution). Ten pieces of 8-inch silicon wafers were spin etched one wafer at a time using a Table 3 and FIG. 7, it was found that if an etching rate decreased, a corresponding etching time increased automatically, from which an etching amount can be controlled to an almost constant value. In this Example, an etching rate of the etching solution after the tenth wafer was spin etched was 1.523 (g/min). The wafer No. 0 in Table 3 is a dummy wafer.

TABLE 3

| | Wafer Nos. | | | | | | | | | | |
|---|---|---|---|---|---|---|---|---|---|---|---|
| | 0 | 1 | 2 | 3 | 4 | 5 | 6 | 7 | 8 | 9 | 10 |
| Weight before etching | 52.11 | 49.09 | 50.01 | 49.99 | 51.18 | 51.19 | 51.18 | 51.2 | 51.21 | 51.21 | 51.24 |
| Weight after etching | 50.72 | 47.67 | 48.59 | 48.54 | 49.77 | 49.74 | 49.76 | 49.77 | 49.8 | 49.78 | 49.81 |
| Etching quantities (g) | 1.39 | 1.42 | 1.42 | 1.45 | 1.41 | 1.45 | 1.42 | 1.43 | 1.41 | 1.43 | 1.43 |
| Etching rates (g/min) | 1.668 | 1.645 | 1.622 | 1.633 | 1.599 | 1.610 | 1.588 | 1.577 | 1.544 | 1.533 | 1.523 |
| Etching times (sec) | 50.0 | 51.8 | 52.5 | 53.3 | 52.9 | 54.0 | 53.7 | 54.4 | 54.8 | 56.0 | 56.3 | spin etching apparatus (MSE-2000, manufactured by Mimasu Semiconductor Industry CO., LTD.). In this experiment, there was used an etching solution which was prepared by adding 0.5 Kg of a 50% solution of hydrofluoric acid into the etching solution that had been used in Example 1 (an etching rate of the used etching solution was decreased to 1.229 (g/min)). In the same way as in Example 1, the wafers were spin etched under condition that an etching amount (an etching stock removal) of each wafer was controlled to a constant value (20 μm: 1.444 g). Since an additional etching solution (a 50% solution of hydrofluoric acid) is added for supplement at the starting stage, the etching rate confirmation treatment step (step 100) of FIG. 1 was performed using a dummy wafer. The etching rate of the etching solution into which the additional etching solution was added for supplement was increased to 1.668 (g/min). Thereafter, a process of Example 3

Figure 8:
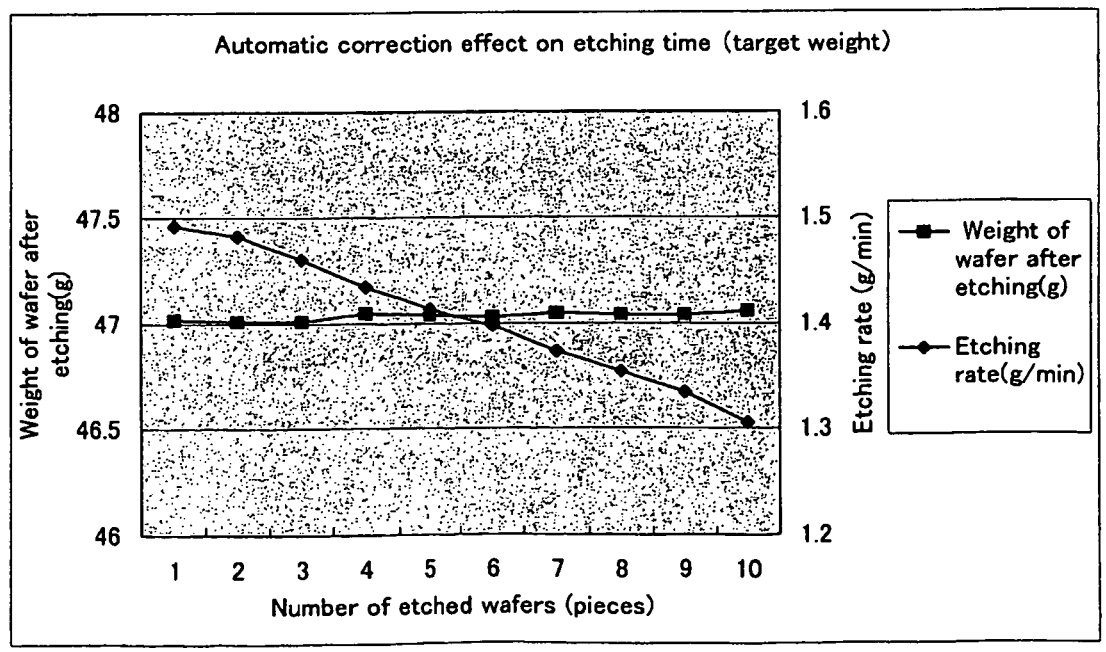
FIG. 8 is a graph showing changes in weight after etching and etching rate to etched wafers in Example 3.

There was conducted an experiment in which finished weight of a wafer is controlled to a constant value (without addition of an additional solution). Ten pieces of 8-inch silicon wafers were spin etched one wafer at a time using a spin etching apparatus (MSE-2000, manufactured by Mimasu Semiconductor Industry CO., LTD.). In this experiment, the etching solution used in Example 2 was used consecutively as it was. An initial etching rate of the etching solution was 1.512 (g/min). The wafers were spin etched under condition that finished weight of each wafer was controlled to a constant value (47.0 g). That is, a process of the first step (step 102) to the seventh step (step 114) shown in the flowchart of FIG. 2 was repeated 10 times to spin etch the ten pieces of the wafers. In the 10-time etching treatment, no additional etching solution was added. An etching amount (g), an etching rate (g/min) and an etching time (sec) were measured on each of the spin etched wafers. The results of the measurement were shown in Table 4 and FIG. 8 (translation of the etching time into a graphic form is omitted). As shown in Table 4 and FIG. 8, it was found that if an etching rate decreased, a corresponding etching time increased automatically, from which weight of the wafer after etching can be controlled to an almost constant value. In this Example, an etching rate of the etching solution after the tenth wafer was spin etched was 1.305 (g/min). The wafer No. 0 in Table 3 is a dummy wafer.

TABLE 4

|  | Wafer Nos. | | | | | | | | | | |
| --- | --- | --- | --- | --- | --- | --- | --- | --- | --- | --- | --- |
|  | 0 | 1 | 2 | 3 | 4 | 5 | 6 | 7 | 8 | 9 | 10 |
| Weight before etching | 50.72 | 48.53 | 48.59 | 47.67 | 49.77 | 49.75 | 49.75 | 49.78 | 49.81 | 49.79 | 49.81 |
| Weight after etching | 49.46 | 47.02 | 47.01 | 47.01 | 47.05 | 47.04 | 47.03 | 47.05 | 47.04 | 47.04 | 47.06 |
| Etching amount (g) | 1.26 | 1.51 | 1.58 | 0.66 | 2.72 | 2.71 | 2.72 | 2.73 | 2.77 | 2.75 | 2.75 |
| Etching rate (g/min) | 1.512 | 1.492 | 1.483 | 1.461 | 1.434 | 1.413 | 1.398 | 1.373 | 1.353 | 1.334 | 1.305 |
| Etching time (sec) | 50.0 | 60.7 | 62.3 | 26.4 | 110.8 | 112.1 | 113.7 | 116.2 | 119.6 | 120.5 | 123.1 |

INDUSTRIAL APPLICABILITY

According to the present invention, there is exerted an effect that uniformity in etching amount in etching treatment can be realized even for wafers each having various conditions, and uniformity of thickness values among etched wafers can also be achieved.

The invention claimed is:

1. A method for controlling an etching amount and an etching solution in spin etching, comprising:
   (a) a first step of taking out one wafer from a loading cassette;
   (b) a second step of measuring the weight $W_1$ of the wafer before etching;
   (c) a third step of calculating an etching time $T_0$ with the following equation (1):

$$T_0 = V_0 \div R \quad (1),$$

wherein $T_0$ is an etching time (min), $V_0$ is a target etching amount (g), R is an initial value $R_0$ (g/min) of an etching rate of a starting etching solution to be used, an etching rate $R_1$ (g/min) of the etching solution after etching or an etching rate $R_2$ (g/min) of the etching solution into which an additional etching solution has been added;
   (d) a fourth step of etching the wafer for the calculated time $T_0$;
   (e) a fifth step of measuring weight $W_2$ of the wafer after etching;
   (f) a sixth step of calculating an etching rate $R_1$ of the etching solution after etching with the following equation (2):

$$R_1 = (W_1 - W_2) \div T_0 \quad (2),$$

wherein $R_1$ is an etching rate of an etching solution after etching, $W_1$ is weight (g) of a wafer before etching, $W_2$ is weight (g) of a wafer after etching and $T_0$ is an etching time;
   (g) a seventh step of accommodating the etched wafer; and
   (h) an eighth step of determining whether or not an etching rate $R_1$ of the etching solution after etching falls within an allowable range,
   wherein when it is decided in the eighth step that an etching rate $R_1$ falls within the allowable range, the process from the first step to the seventh step is performed on a wafer to be processed in the next order, or when it is decided in the eighth step that an etching rate $R_1$ falls outside the allowable range, there is performed a ninth step of adding an additional etching solution into the etching solution to restore the etching rate $R_1$ to the etching rate $R_2$ in the vicinity of the initial value $R_0$, and thereafter the process from the first step to the seventh step is performed on a wafer to be processed in the next order.

2. The method according to claim 1, wherein confirmation treatment is performed for the initial value $R_0$ of the etching rate of the starting etching solution and/or the etching rate $R_2$ of the etching solution which has been restored to a value in the vicinity of the initial value by adding an additional etching solution into the used etching solution.

3. The method according to claim 2, wherein the confirmation treatment for the etching rate comprises:
   (a) a first step of taking out one wafer from a dummy wafer holding table;
   (b) a second step of measuring weight $D_1$ of the dummy wafer before etching;
   (c) a third step of etching the dummy wafer for a given time $t_0$;
   (d) a fourth step of measuring weight $D_2$ of the dummy wafer after etching;
   (e) a fifth step of calculating an etching rate $r_0$ of the etching solution after etching with the following equation (6):

$$r_0 = (D_1 - D_2) \div t_0 \quad (6),$$

wherein $r_0$ is an etching rate (g/min) of the etching solution after etching, $D_1$ is weight (g) of the dummy wafer before etching, $D_2$ is weight (g) of the dummy wafer after etching, and $t_0$ is an etching time;
   (g) a seventh step of transferring the etched dummy wafer to the dummy wafer holding table; and
   (h) an eighth step of determining whether or not weight of the etched dummy wafer falls within a defined range;
   wherein when it is decided in the eighth step that weight of the dummy wafer falls within the defined range, the confirmation treatment for the etching rate is terminated, or when it is decided in the eighth step that the weight of the dummy wafer falls outside the defined range, there is performed a ninth step of generating an exchange request signal for the used dummy wafer, and thereafter the confirmation treatment for the etching rate is terminated.

4. A method for controlling an etching amount and an etching solution in spin etching, comprising:
   (a) a first step of taking out one wafer from a loading cassette;
   (b) a second step of measuring the weight $W_1$ of the wafer before etching;
   (c) a third step of determining an etching amount V with the following equation (3):
   $$V = W_1 - W_0 \quad (3),$$
   wherein V indicates an etching amount (g), $W_1$ is weight (g) of a wafer before etching, and $W_0$ is weight of a finished wafer, that is a target weight (g) of a wafer after etching;
   (d) a fourth step of calculating an etching time T with the following equation (4):
   $$T = V \div R \quad (4),$$
   wherein T is an etching time (mm), V is a target etching amount (g), R is an initial value $R_0$ (g/min) of an etching rate of a starting etching solution, an etching rate $R_1$ (g/min) of the etching solution after etching or an etching rate $R_2$ (g/min) of the etching solution into which an additional etching solution has been added;
   (e) a fifth step of etching the wafer;
   (f) a six step of measuring weight $W_2$ of the wafer after etching;
   (g) a seventh step of calculating an etching rate $R_1$ of the etching solution after etching with the following equation (5):
   $$R_1 = (W_1 - W_2) \div T \quad (5),$$
   wherein $R_1$ is an etching rate (g/min) of the etching solution after etching, $W_1$ is weight (g) of a wafer before etching, $W_2$ is weight (g) of a wafer after etching and T is an etching time,
   (h) an eighth step of accommodating the etched wafer; and
   (i) a ninth step of determining whether or not an etching rate $R_1$ of the etching solution after etching falls within an allowable range;
   wherein when it is decided in the ninth step that an etching rate $R_1$ falls within the allowable range, the process from the first step to the seventh step is performed on a wafer to be processed in the next order, or when it is decided in the ninth step that an etching rate $R_1$ falls outside the allowable range, there is performed a tenth step of adding an additional etching solution into the etching solution to restore the etching rate $R_1$ to the etching rate $R_2$ in the vicinity of the initial value $R_0$, and thereafter the process from the first step to the eighth step is performed on a wafer to be processed in the next order.

5. The method according to claim 2, wherein confirmation treatment is performed for the initial value $R_0$ of the etching rate of the starting etching solution and/or the etching rate $R_2$ of the etching solution which has been restored to a value in the vicinity of the initial value by adding an additional etching solution into the used etching solution.

6. The method according to claim 5, wherein the confirmation treatment for the etching rate comprises:
   (a) a first step of taking out one wafer from a dummy wafer holding table;
   (b) a second step of measuring weight $D_1$ of the dummy wafer before etching;
   (c) a third step of etching the dummy wafer for a given time $t_0$;
   (d) a fourth step of measuring weight $D_2$ of the dummy wafer after etching;
   (e) a fifth step of calculating an etching rate $r_0$ of the etching solution after etching with the following equation (6):
   $$r_0 = (D_1 - D_2) \div t_0 \quad (6),$$
   wherein $r_0$ is an etching rate (g/min) of the etching solution after etching, $D_1$ is weight (g) of the dummy wafer before etching, $D_2$ is weight (g) of the dummy wafer after etching, and $t_0$ is an etching time;
   (g) a seventh step of transferring the etched dummy wafer to the dummy wafer holding table; and
   (h) an eighth step of determining whether or not weight of the etched dummy wafer falls within a defined range;
   wherein when it is decided in the eighth step that weight of the dummy wafer falls within the defined range, the confirmation treatment for the etching rate is terminated, or when it is decided in the eighth step that the weight of the dummy wafer falls outside the defined range, there is performed a ninth step of generating an exchange request signal for the used dummy wafer, and thereafter the confirmation treatment for the etching rate is terminated.

* * * * *